May 17, 1960 D. C. FELT 2,936,808

WIRE FORMING DEVICE

Filed Sept. 7, 1956

INVENTOR.
DAVID COAN FELT

BY Darby & Darby

ATTORNEYS

United States Patent Office 2,936,808

Patented May 17, 1960

2,936,808

WIRE FORMING DEVICE

David Coan Felt, Bergenfield, N.J., assignor to Allen B. Du Mont Laboratories, Inc., Clifton, N.J., a corporation of Delaware Application September 7, 1956, Serial No. 608,500

5 Claims. (Cl. 153—16)

This invention relates to flattening devices, and more particularly to a device for flattening the riser wires of a module against a coacting printed wiring board.

In the past, electronic equipment has utilized wires to interconnect various components. Advances in the art have introduced two new elements; namely, printed wiring boards, and modules.

The printed wiring boards replace the previously used wires by substituting a sheet of insulative material having strips of conductive material printed or otherwise attached to one or more surfaces thereof. Electrical components are positioned on the printed wiring board in such a manner that their lead-wires contact the conductive strips. Most satisfactory soldering is achieved when the conductive strips and the lead-wires have intimate surface contact, i.e., when the wire is actually flattened against the conductive strip.

Modules are unitary structures which comprise wafers, generally of ceramic materials. The wafers have attached to their surfaces electrical components, such as resistors and capacitors, with their leads extending to the edges of the wafers. Several wafers are stacked one above the other in a parallel relationship, and "riser wires" connect the lead wires of the various electrical components on the individual wafers. The riser wires project above the uppermost wafer to provide a connection with the conductive strips of the printed wiring board. There are generally a row of three riser wires along each wafer edge.

In use, a module is placed beneath a square hole in the printed wiring board, with the margins of the uppermost surface of the top wafer resting against the lower surface of the printed wiring board, and the riser wires project through the opening. (If a socket is used it is placed in the opening of the board and seated on the upper surface of the uppermost wafer.) The riser wires are then flattened down to make contact with the printed wiring on the upper surface of the board.

Some prior art wire-flattening devices used "brute force" mechanisms which pressed against the ends of riser wires, causing them to buckle downwardly. However, the buckling did not provide good surface contact between the riser wires and the printed wiring surface, and the pressure frequently fractured the brittle ceramic wafers.

Other prior art wire-flattening devices inserted a blade interiorly of a row of riser wires, and forced them outward. Since the forcing element described an arc, the ends of the riser wires were never really flattened against the printed wiring board.

It is therefore the principal object of my invention to provide an improved flattening device.

It is another object of my invention to provide a flattening device for the riser wires of an electronic module.

These objects and others will be realized from the following specification, taken in conjunction with the drawings, of which:

My invention contemplates a knee-action device which inserts the leading edge of a pivoted blade between a row of riser wires and a bearing surface, causes the blade to pivot about its pivot point, and then follows the pivoting action with a true flattening action—thus completely flattening the riser wires without exerting any pressure on the module.

Figure 1:
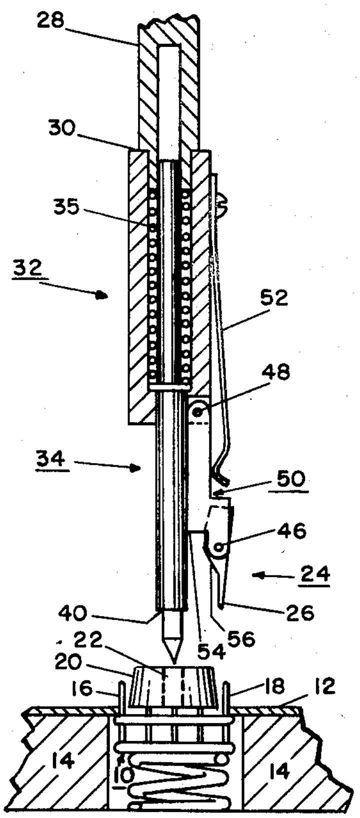
Fig. 1 depicts my invention at the beginning of the flattening operation.

Referring now to Fig. 1, there is illustrated a module 10 which has been positioned with respect to a mating hole in a printed wiring board 12. As shown, resilient means, such for example as a spring or a body of rubber or plastic, supports module 10, while the printed wiring board 12 rests upon a support 14 having a recess for the module. Module 10 is shown, for simplicity, as comprising only two wafers. Riser wires 16 and 18 are each part of a row, the others being hidden from sight. Other riser wires are shown as extending upward along the distant edge of the module, their upper portions being hidden by tube socket 20, which has a centering hole 22.

In operation ram 28 is lowered, exerting a direct downward pressure via shoulder 30 onto ram block 32, and an indirect pressure on holding device 34 through the action of a helical spring 35. Downward movement of ram 28 causes the tapered point of centering device 34 to enter centering hole 22 until shoulder 40 presses firmly against the top of socket 20, thus holding module 10 in place.

Downward movement of ram 28 also lowers ram block 32, connecting link 50, and blade 24 has an edge which overlaps the opening in the printed wiring board and cannot therefore descend further than the upper surface of the board. Ramp 28 causes blade 24 to be lowered until the entering edge of blade 24 fits between the edge of socket 20 and the row of riser wires represented by wire 18. When the overlapping edge of blade 24 strikes the upper surface of printed wiring board 12 at one side of the opening a knee-action of blade 24 occurs, the blade resting upon the upper surface of the printed wiring board and the side of socket 20 constituting a biasing surface. This knee-action results from the placing of pivot pin 46 slightly outside the action line between the point of engagement of blade 24 with a printed wiring board 12 and pivot pin 48 of connecting link 50. Continuing downward motion of ram block 32 causes blade 24 to pivot further about its edge and to move outwardly as respects socket 20, the pivoting being permitted by link 50 which in turn pivots around pin 48 against the force of spring 52.

This pivoting knee-action of blade 24 forces flattening surface 26 against the row of riser wires, causing them to bend at the upper edge of printed wiring board 12.

Figure 2:
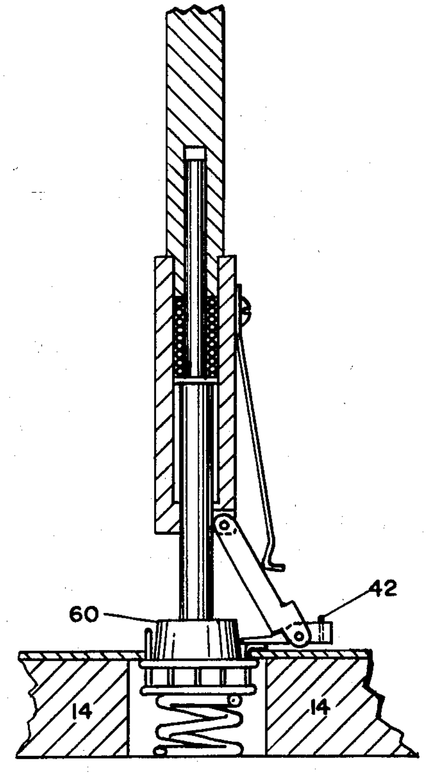
Fig. 2 illustrates the relationship of the parts at the end of the flattening operation.

Referring now to Fig. 2, it will be seen that the knee-action continues until shoulder 54 of connecting link 50 engages shoulder 56 of blade 24. (These shoulders are more clearly discernible in Fig. 1.) At this point, no further pivoting can occur and any further downward motion imparted to link 50 causes the flattening surface 26 of blade 24 to firmly press riser wire 18 against printed wiring board 12 while at the same time causing sliding movement away from the board edge to "iron" the riser wires against the printed wiring on the surface of board 12. Printed wiring board is supported by structure 14 so there is no danger of fracturing the board, and the module is protected since no pressure has been applied thereto.

The foregoing explanation has dealt with the flattening of one row of riser wires, but it will be understood that since there are four rows, four sets of blades will be necessary.

When ram 28 is raised, spring 52 and a hair spring wound around pivot pin 46 coact to return all the mechanical linkages to their original position.

While most modules incorporate a socket, such as 20, some of them do not. In this case, my device as shown in Figure 2, contemplates a block 60 attached to holding device 34 to replace the tapered pin and tube socket 20. This block will be pressed against the module according to the strength of the helical spring 35, and will hold it firmly in place while the described wire-flattening action occurs. In this case block 60 acts as the bearing surface.

If desired the leading edge of blade 24 may be positioned by an adjustable set screw 42 (shown in Fig. 2) which bears against a portion of connecting link 50. A further positioning refinement may be introduced by properly curving or beveling the section of blade 24 between its entering edge and its shoulder 56. This curved portion will then slide against the upper edge of socket 20, and thus aid in positioning the entering edge of blade 24.

I have described the principles and one embodiment of my invention. Since other variations will occur to those in related arts, I desire not be limited by the foregoing example but rather by the claims granted to me.

What is claimed is:

1. A device for bending a row of wires placed against the edge of a printed wiring board and perpendicular to its surface into intimate contact with printed wiring on the adjacent surface of the board comprising, in combination, a ram mounted for reciprocatory movement perpendicular to the plane of the board on a line outwardly of the board edge, a link pivotally mounted on said ram at a point outwardly of the board edge, a wire bending blade pivotally mounted on said link, means normally holding said link in position wherein said blade is positioned with its leading edge outwardly of the wires and its trailing edge inwardly of said leading edge as the ram moves toward the board, said blade pivoting about its mounting to flatten said wires, means comprising a bearing surface mounted outwardly of said board edge against which said leading edge of said blade bears during said pivoting movement, said link then causing said blade to move inwardly in contact with the wires to bend the wires over the board edge and against the upper surface of the board, and means limiting the pivotal movement of said blade on said link.

2. A device for bending a row of wires placed against the edge of a printed wiring board and perpendicular to its surface into intimate contact with printed wiring on the adjacent surface of the board comprising, in combination, a ram mounted for reciprocatory movement perpendicular to the plane of the board on a line outwardly of the board edge, a link pivotally mounted on said ram at a point outwardly of the board edge, a wire bending blade pivotally mounted on said link, means normally holding said link in position wherein said blade is positioned with its leading edge outwardly of the board edge and its trailing edge inwardly of said leading edge as the ram moves toward the board, said blade pivoting about its mounting to flatten said wires, said link then causing said blade to move inwardly in contact with the wires to bend the wires over the board edge, and means on said link and said blade to limit the pivotal movement of said blade on said link to a position in which the surface of said blade is parallel to the board whereby further movement of said ram flattens the wires into intimate contact with the wiring on the board throughout their length.

3. A device for bending a row of wires placed against the edge of a printed wiring board and perpendicular to its surface into intimate contact with printed wiring on the adjacent surface of the board comprising, in combination, a ram mounted for reciprocatory movement perpendicular to the plane of the board on a line outwardly of the board edge, a link pivotally mounted on said ram at a point outwardly of the board edge, a wire bending blade pivotally mounted on said link, means normally holding said link in position wherein said blade is positioned with its leading edge outwardly of the board edge and its trailing edge inwardly of its leading edge as the ram moves toward the board, said blade pivoting about its mounting to flatten said wires, said link then causing said blade to move inwardly in contact with the wires to bend the wires over the board edge, and means for adjusting the angle of said blade relative to said link when said ram is in normal position.

4. A device for flattening the riser wires of a module against conductors on a printed wiring board comprising, in combination, means to hold the module against the board with the riser wires adjacent an edge of the board, a ram mounted for reciprocatory movement perpendicular to the plane of the board surface on a line outwardly of the board edge, a link pivotally mounted on said ram at a point outwardly of the board edge, a wire bending blade pivotally mounted on said link, means holding said link in position substantially parallel to the line of action of the ram, means normally holding said blade in position on said link so that its leading edge lies outwardly of the riser wires and its trailing edge inwardly of its leading edge, said blade pivoting about said wires as said ram moves toward the board to bend said wires, said link then causing said blade to move inwardly in contact with the wires and means on said link and said blade to limit the pivotal movement of said blade of said link to a position in which the surface of said blade is parallel to the board whereby further movement of said ram flattens the wire throughout its length into intimate contact with the wiring on the board.

5. A device as claimed in claim 4, wherein said module holding means comprises a holding member mounted on said ram and bearing against the module, and a cooperating member spaced outwardly from the board edge and positioned on the module, said cooperating member having a bearing surface against which the leading edge of said blade bears to assure said pivoting action of said blade about said link.

References Cited in the file of this patent

UNITED STATES PATENTS

| | | |
|---|---|---|
| 1,450,961 | Otterbein | Apr. 10, 1923 |
| 1,580,278 | Bartels | Apr. 13, 1926 |
| 1,664,619 | Girard | Apr. 3, 1928 |
| 1,854,371 | Engel | Apr. 19, 1932 |
| 2,401,031 | Wanasek | May 28, 1946 |
| 2,840,134 | Rayburn et al. | June 24, 1958 |